United States Patent [19]
Chang et al.

[11] Patent Number: 6,114,226
[45] Date of Patent: Sep. 5, 2000

[54] METHOD OF MANUFACTURING ELECTROSTATIC DISCHARGE PROTECTIVE CIRCUIT

[75] Inventors: Yih-Jau Chang, Hsinchu; Chen-Chung Hsu, Hsinchu Hsien, both of Taiwan

[73] Assignee: United Microelectronics Corp, Hsinchu, Taiwan

[21] Appl. No.: 09/246,608

[22] Filed: Feb. 8, 1999

[51] Int. Cl.$^7$ .................................................... H01L 21/04
[52] U.S. Cl. ........................... 438/510; 438/706; 438/719; 438/689
[58] Field of Search .................................. 438/689, 706, 438/719, 510

[56] References Cited

U.S. PATENT DOCUMENTS

| | | | |
|---|---|---|---|
| 5,308,782 | 5/1994 | Mazuré et al. ........................... | 437/52 |
| 5,543,650 | 8/1996 | Au et al. .................................. | 257/355 |
| 5,946,573 | 8/1999 | Hsu ......................................... | 438/275 |
| 5,953,616 | 9/1999 | Ahn ......................................... | 438/305 |
| 5,982,017 | 11/1999 | Wu et al. ................................. | 257/513 |

*Primary Examiner*—Benjamin L Utech
*Assistant Examiner*—Vanessa Perez-Romos
*Attorney, Agent, or Firm*—J.C.Patents; Jiawei Huang

[57] ABSTRACT

A method for manufacturing an electrostatic discharge (ESD) protective circuit. By using the method according to the invention, since the Zener diode, which has low trigger voltage and low power consumption, is formed in the electrostatic protective circuit, the protective ability of the ESD protective circuit is greatly improved as the integration is relatively high. Furthermore, it is necessary to use an extra photo mask as the ESD implantation step and the Zener breakdown implantation step are performed when the internal circuit and the ESD protective circuit are formed simultaneously, so that the cost is reduced.

19 Claims, 4 Drawing Sheets

METHOD OF MANUFACTURING ELECTROSTATIC DISCHARGE PROTECTIVE CIRCUIT

BACKGROUND OF THE INVENTION

1. Field of the Invention

The present invention relates to a method of manufacturing a semiconductor device. More particularly, the present invention relates to a method of manufacturing an electrostatic discharge protective circuit.

2. Description of the Related Art

Electrostatic discharge (ESD) is one of the major causes for an integrated circuit (IC) to be damaged in an IC fabrication process. This is especially true for fabrication of a deep sub-micron IC. In order to overcome the problems caused by static electricity, an ESD protective circuit is incorporated between an internal circuit and a pad.

Additionally, because the gate oxide layer become thinner as the integration of the semiconductor devices is increased, the breakdown voltage of the gate oxide layer approaches or is lower than that of the source/drain. Therefore, the protection provided by the ESD protective circuit becomes less effective. Moreover, the internal circuit design usually follows the minimum design rules, so the allowance spaces between the contact hole and the edge of the doped region and between the contact hole and the edge of the gate electrode are too small to resist the huge electrostatic-discharge transient current. Hence, the chips are easily damaged by the ESD when the integration is high.

Typically, a coupled diode or a coupled metal-oxide semiconductor (MOS) is used as the ESD protective circuit. Since the power consumption of the coupled diode or coupled metal-oxide semiconductor is very large, the ESD protective circuit cannot resist the relatively high stress of the ESD. When the breakdown voltage of the gate oxide layer is lowered to a breakdown voltage of a MOS junction due to the reduction of the thickness of the gate oxide layer, the protecting performance of the ESD protective circuit is very much degraded.

FIGS. 1A through 1D are schematic, cross-sectional views of the conventional process for manufacturing an ESD protective circuit.

As shown in FIG. 1A, a substrate 10 having an isolation region 12 is provided. The isolation region 12 is used to define a device region 14 and a protective circuit region 16 in the substrate 10. The device region 14 and the protective circuit region 16 respectively comprise MOS transistors 18 and 20. The MOS transistor 18 includes a gate oxide layer 22, a polysilicon layer 24, a spacer 26 and a source/drain region 28 with a lightly doped drain (LDD) region (the source/drain region 28 comprises an N+ doped region and an N− doped region). The MOS transistor 20 includes a gate oxide layer 30, a polysilicon layer 32, a spacer 34 and a source/drain region 36 with an LDD region (the source/drain region 36 comprises an N+ doped region and an N− doped region).

As shown in FIG. 1B, self-aligned silicide (salicide) layers 38, 39, 40 and 41 are respectively formed on the polysilicon layers 24 and 32 and on the source/drain region 28 and 36 by a (salicide) process.

As shown in FIG. 1C, a patterned photoresist 42 is respectively formed to cover the device region 14, the salicide layer 40 and a portion of the salicide layer 41 of the protective circuit region 16. The distance between portions of the patterned photoresist 42 above the salicide layers 40 and 41 is about 2 micrometers. A portion of the salicide layer 41 exposed by the patterned photoresist 42 is stripped away by dry etching until a portion of the source/drain region 36 is exposed.

As shown in FIG. 1D, the photoresist 42 is removed. A photoresist 44 is formed to cover the device region 14. The spacer 34 is removed by using the photoresist 44 as a mask. An ion implantation step is used to form a doped region with a relatively high dosage (e.g., using N+ ions) in a portion of the source/drain region 36 previously covered by the spacer 34. Therefore, the source/drain region 36 is converted into a source/drain region 36a. In the subsequent process the photoresist 44 is stripped away. Subsequent conventional techniques well known to those skilled in the art are performed to complete the semiconductor device.

Typically, the ESD protective circuit and the internal circuit are simultaneously formed. Since the structure of the conventional ESD protective circuit comprises an N-type doped region with a relatively high dosage, the junction resistance can be decreased to achieve a uniform power dissipation. However, the junction breakdown voltage cannot be reduced even though the structure of the conventional ESD protective circuit comprises an N-type doped region with relatively high dosage. Hence, the protective ability of the ESD protective circuit is poor when the gate oxide layer is thinner than 35 angstroms.

SUMMARY OF THE INVENTION

The invention provides a method of manufacturing an electrostatic discharge protective circuit. By using the invention, the thin oxide layer can resist the huge electrostatic-discharge transient current and the wafer can be prevented from being damaged by the electrostatic discharge.

To achieve these and other advantages and in accordance with the purpose of the invention, as embodied and broadly described herein, the invention provides a method of manufacturing an electrostatic discharge protective circuit with an internal circuit. A substrate having a protective region and a device region is provided, and the protective region and the device region comprises a first metal-oxide semiconductor transistor and a second metal-oxide semiconductor transistor, respectively, wherein the first metal-oxide semiconductor transistor comprises a gate electrode, a spacer on a sidewall of the gate electrode and a source/drain region having a first conductive type with alightly doped drain region beneath the spacer. A salicide layer is formed on the source/drain region and the gate electrode of the first metal-oxide semiconductor transistor and on a portion of the second metal-oxide semiconductor transistor conductive region. The salicide on the gate electrode and a portion of the salicide layer covering a potion of the soruce/drain region adjacent to the gate electrode are removed. A doped region with a second conductive type is formed at portions of a junction of the source/drain region of the first metal-oxide semiconductor transistor without covering by the remaining salicide layer, the gate electrode and the spacer. The spacer is removed. The lightly doped drain region is converted into a heavily doped region with the first conductive type and a diode with a structure of the first-the second-the first conductive type is simultaneously formed in the protective region. In the invention, since the Zener diode, which has low trigger voltage and low power consumption, is formed in the electrostatic protective circuit, the protective ability of the ESD protective circuit is greatly improved as the integration is relatively high. Furthermore, it is unnecessary to use an extra photo mask as the ESD implantation step and the Zener breakdown implantation step are performed when the internal circuit and the ESD protective circuit are formed simultaneously, so that the cost is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in an constitute a part of this specification. The drawings illustrate embodiments of the invention and, together with the description, serve to explain the principles of the invention. In the drawings.

DESCRIPTION OF THE PREFERRED EMBODIMENTS

Figure 1A:
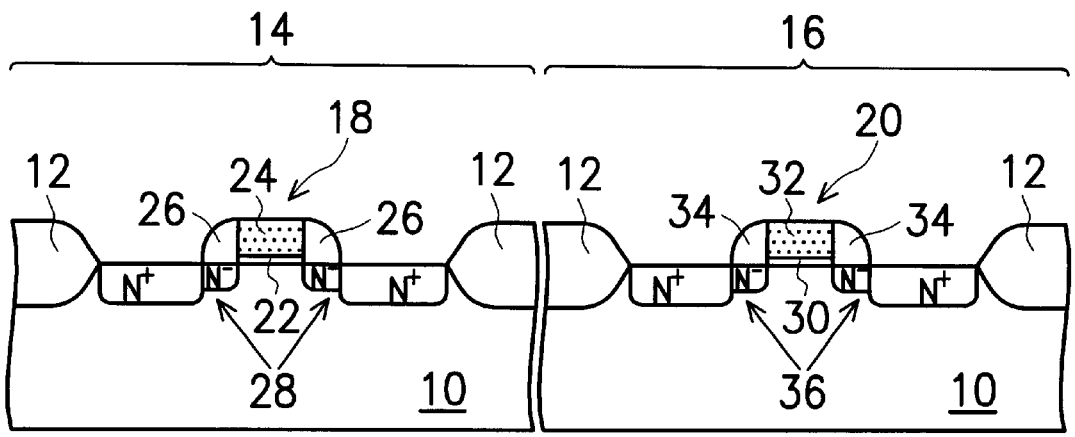
FIGS. 1A through 1D are schematic, cross-sectional views of the conventional process for manufacturing an ESD protective circuit.
Figure 1B:
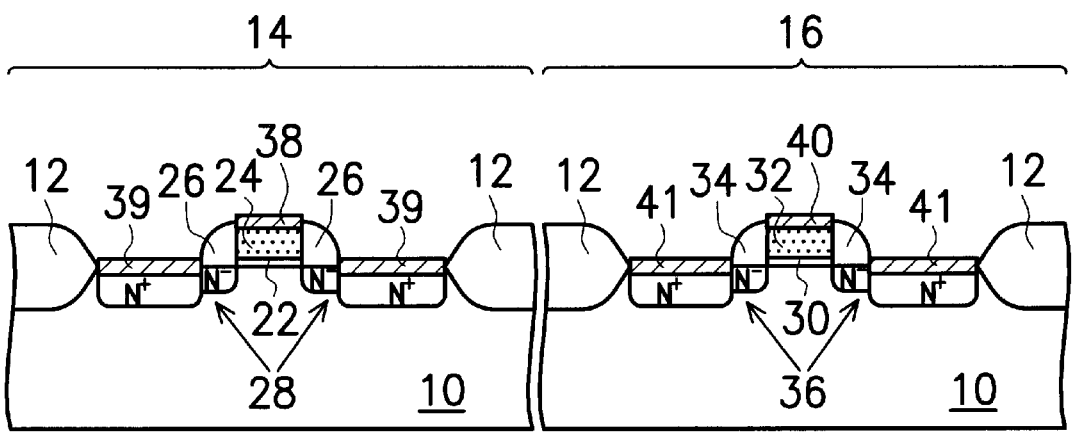
Figure 1C:
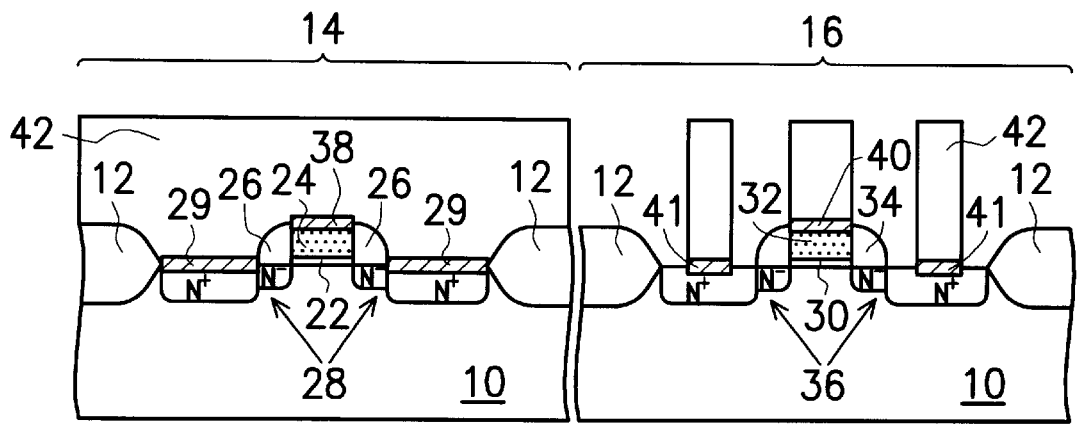
Figure 1D:
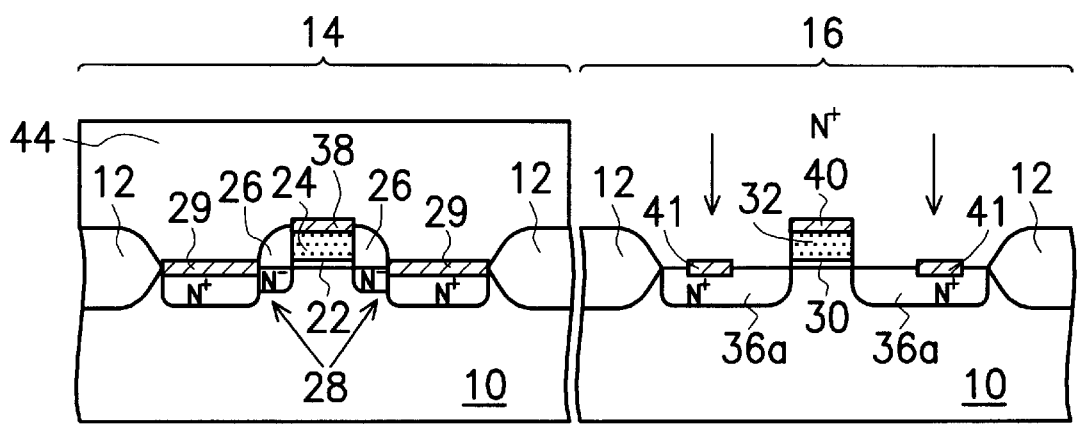

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic, cross-sectional views of the process for manufacturing an ESD protective circuit.

Figure 2A:
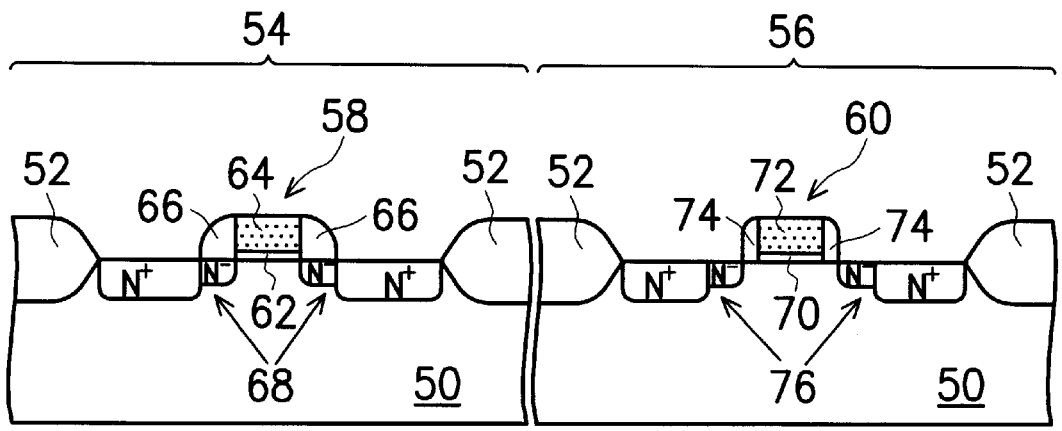
FIGS. 2A through 2E are schematic, cross-sectional views of the process for manufacturing an ESD protective circuit.

As shown in FIG. 2A, a substrate 50 having an isolation region 52 is provided. The isolation region 52 is used to define a device region 54 and a protective circuit region 56 in the substrate 50. The isolation region 52 can be a shallow trench isolation structure or a field oxide layer, for example. The device region 54 and the protective circuit region 56 respectively comprise MOS transistors 58 and 60. The MOS transistor 58 includes a gate oxide layer 62, a conductive layer 64, a spacer 66 and an N-type source/drain region 68 with a LDD region beneath the spacer 66 (the source/drain region 68 comprises an N⁻ doped region and an N⁻ doped region). The conductive layer 64 is used as a gate electrode, and it can be a polysilicon layer, for example. The MOS transistor 60 includes a gate oxide layer 70, a conductive layer 72, a spacer 74 and an N-type source/drain region 76 with an LDD region beneath the spacer 74 (the source/drain region 76 comprises an N⁺ doped region and N⁻ doped region). The conductive layer 72 is used as a gate electrode, and it can be a polysilicon layer, for example.

Figure 2B:
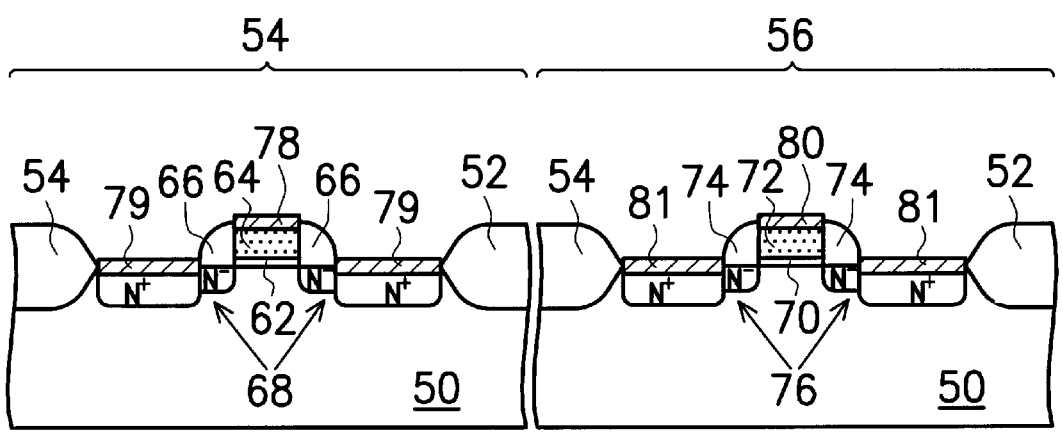

As shown in FIG. 2B, salicide layers 78, 79, 80 and 81 are respectively formed on the conductive layers 64 and 72 and on the source/drain region 68 and 76 by (salicide) process.

Figure 2C:
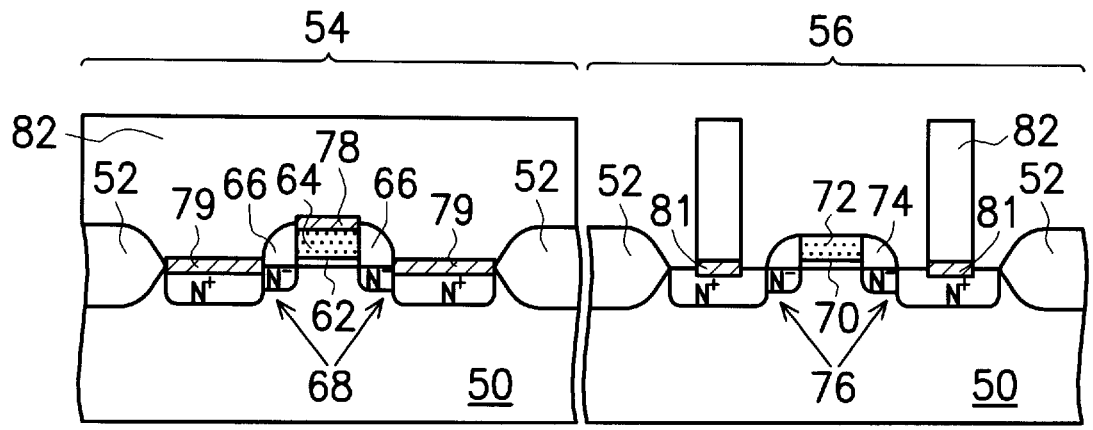

As shown in FIG. 2C, a patterned photoresist 82 are respectively formed to cover the device region 54 and a portion of the salicide layer 81 of the protective circuit region 16. The salicide layer 80 and a portion of the salicide layer 81, which are exposed by the patterned photoresist 82, are stripped away by dry etching until the conductive layer 72 and a portion of the source/drain region 76 are exposed. The distance between the remaining salicide layer 81 beneath the patterned photoresist 82 in the protective region 56 and the conductive layer 72 is about 2 micrometers.

Figure 2D:
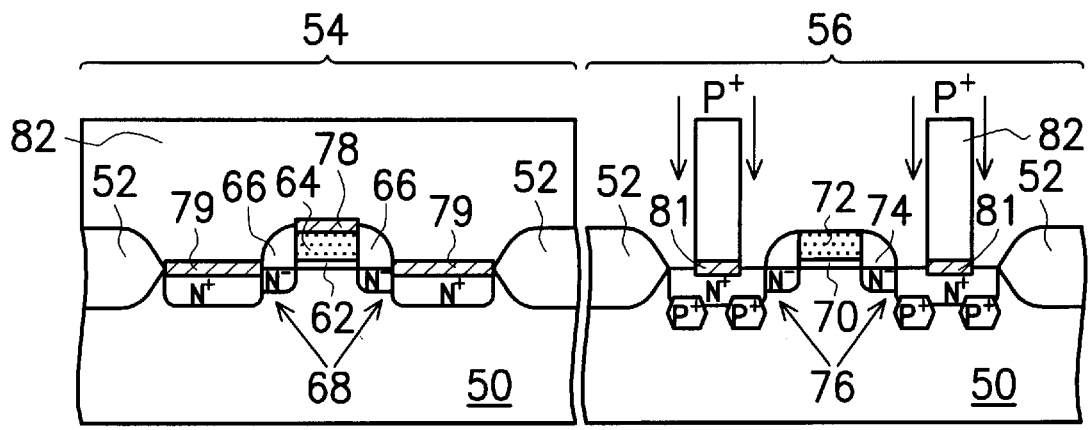

As shown in FIG. 2D, an ion implantation step, which is a Zener breakdown implantation step, is used to form P⁺-type doped regions 90 in portions of the junction of the source/drain region 76 exposed by the patterned photoresist 82 and the spacer 74. Preferably, in this example the implanting energy is about 50–200 KeV, the dosage of the implantation step is about $10^{14}$~$10^{16}$ atoms/cm², and the implanting ions can be boron ions. Accordingly, a P-N-P Zener diode structure is denoted in FIG. 2D.

Figure 2E:
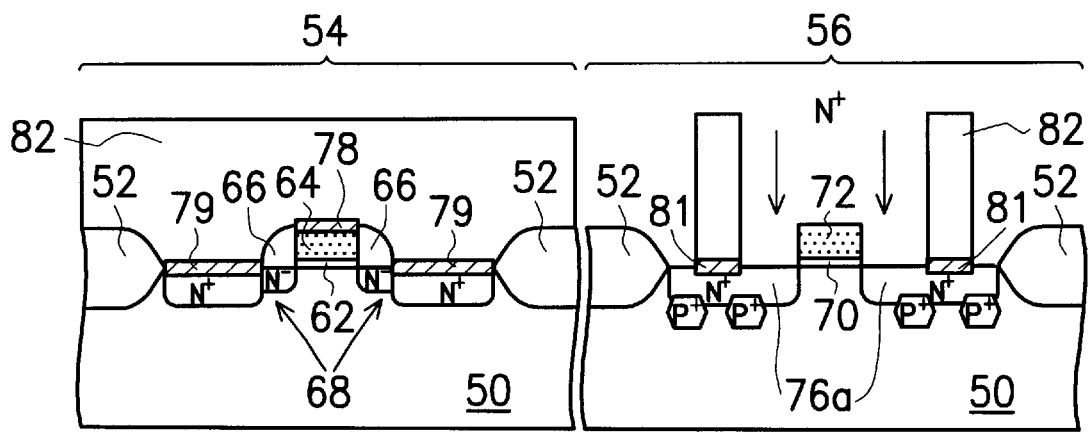

As shown in FIG. 2E, the spacer 74 is removed by using the photoresist 82 as a mask. An ion implantation step, which is an ESD implantation step, is used to convert the LDD region into an N-type heavy doped region with a relatively high dosage (e.g. an N⁺ doped region) in a portion of the source/drain region 76 previously covered by the spacer 74. Therefore, the source/drain region 76 is converted into a source/drain region 76a. In the subsequent process the photoresist 82 is stripped away. Subsequent conventional techniques well known to those skilled in the art are performed to complete the semiconductor device.

In the preferred embodiment according to the invention, the conductive types of the source/drain regions 76 and 76a and the doped regions 90 are respectively denoted as N-type and P-type. Since the conductive type of the source/drain regions 76 and 76a should be different from that of the doped regions 90, in application of the invention, the conductive type of the source/drain 76 and the doped regions 90 also can be respectively denoted as P-type and N-type.

In the invention, a Zener diode structure such as P-N-P or N-P-N is formed in the ESD protective circuit. The required trigger voltage of the Zener diode can be reached by controlling the concentration of the N-type ions or P-type ions of the Zener diode. Correspondingly, by decreasing the trigger voltage, the ESD protective circuit still can protect the thin gate oxide layer, as the integration is relatively high. Additionally, the lower the trigger voltage is, the less the power consumption is. Therefore, the heat effect of the Zener diode is relatively low, which protects the thin gate oxide layer from the damage caused by the ESD and the protective ability of the ESD protective circuit can be enhanced. Moreover, the typical turn-on voltage of the Zener diode is about 5–10V. By comparing the turn-on voltage of the Zener diode with the trigger voltage of the conventional ESD, which is about 10–15V, the protective ability of the ESD protective circuit with the Zener diode structure according to the invention is extremely improved.

Furthermore, the internal circuit and the ESD protective circuit are formed simultaneously, so it is necessary to use an extra photo mask when the ESD implantation step and the Zener breakdown implantation step are performed. Therefore the cost is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing an electrostatic discharge protective circuit with an internal circuit on a substrate, the substrate having a protective region and a device region, and the protective region and the device region comprises a first metal-oxide semiconductor (MOS) transistor and a second MOS transistor, respectively, wherein the first MOS transistor includes a first electrode, a spacer on a sidewall of the gate electrode, and a source/drain region in the substrate at each side of the gate electrode, the source/drain region with dopants of a first conductive type having a lightly doped drain region beneath the spacer, the method comprising the steps of:

forming a salicide layer on the source/drain region and the gate electrode of the first MOS transistor, wherein a device's salicide layer at the device region may also be formed on an exposed surface of the second MOS transistor containing silicon;

forming a patterned photoresist layer to cover a portion of the salicide layer about at the central region at each side of the gate electrode, whereby a portion of the salicide other than the central region is exposed;

removing the exposed portion of the salicide layer to expose a portion of the source/drain region, using a mask comprising the patterned photoresist layer, the spacer, and the gate electrode, wherein a remaining portion of the salicide layer still covers the source/drain region about at the central region;

implanting dopants of a second conductive type into the substrate beneath the source/drain region to form a second-conductive-type doped region, using a mask comprising the patterned photoresist layer, the spacer, and the gate electrode, whereby the second-conductive-type doped region and the source/drain region form a diode;

removing the spacer on the sidewall of the gate electrode to expose the lightly doped drain region; and doping the lightly doped drain region to be a heavily doped region, so as the merge the lightly doped drain region into the source/drain region.

2. The method of claim 1, wherein the first conductive type is N-type and the second conductive type is P-type.

3. The method of claim 1, wherein the first conductive type is P-type and the second conductive type is N-type.

4. The method of claim 1, wherein the distance between the gate electrode and the remaining salicide layer in the protective region is about 2 micrometers.

5. The method of claim 1, wherein the step of implanting dopants of a second conductive type into the substrate comprises an implanting energy of about 50–200 KeV, a dosage of about $10^{14}$~$10^{16}$ atoms/cm$^2$, and boron ions as the dopants.

6. The method of claim 1, wherein the step of removing the exposed portion of the salicide layer includes dry etching.

7. The method of claim 1, wherein the diode associating with the source/drain region forms a structure of a P-N-P diode.

8. The method of claim 1, wherein the diode associating with the source/drain region forms a structure of an N-P-N diode.

9. A method of manufacturing an electrostatic discharge protective circuit on a substrate having a gate electrode, a source/drain region doped with dopants of a first conductive type in the substrate at each side of the gate electrode, the method comprising the steps of:

forming a salicide layer on the source/drain region and the gate electrode;

forming a patterned photoresist layer to cover a portion of the salicide layer about at the central region at each side of the gate electrode, whereby a portion of the salicide other than the central region is exposed;

removing the exposed portion of the salicide layer to expose a portion of the source/drain region, using a mask comprising the patterned photoresist layer and the gate electrode, wherein a remaining portion of the salicide layer still covers the source/drain region about at the central region; and implanting dopants of a second conductive type into the substrate beneath the source/drain region to form a second-conductive-type doped region, using a mask comprising the patterned photoresist layer and the gate electrode, whereby the second-conductive-type doped region and the source/drain region form a diode.

10. The method of claim 9, wherein the first conductive type is N-type and the second conductive type is P-type.

11. The method of claim 9, wherein the first conductive type is P-type and the second conductive type is N-type.

12. The method of claim 9, wherein the distance between the gate electrode and the remaining salicide layer is about 2 micrometers.

13. The method of claim 9, wherein the step of implanting dopants of a second conductive type into the substrate comprises an implanting energy of about 50–200 KeV, a dosage of about $10^{14}$~$10^{16}$ atoms/cm$^2$, and boron ions as the dopants.

14. The method of claim 9, wherein the step of removing the exposed portion of the salicide layer includes dry etching.

15. The method of claim 9, wherein the diode associating with the source/drain region forms a structure of a P-N-P diode.

16. The method of claim 9, wherein the diode associating with the source/drain region forms a structure of an N-P-N diode.

17. The method of claim 9, wherein the source/drain region comprises a lightly doped drained (LDD) region under a spacer formed on each side of the gate electrode.

18. The method of claim 17, wherein the method further comprises:

removing the spacer on the sidewall of the gate electrode to expose the LDD region; and doping the LDD region to be a heavily doped region, so as to merge the LDD region into the source/drain region.

19. The method of claim 1, wherein the source/drain region and the gate electrode are simultaneously formed in a protective region on the substrate while a metal-oxide semiconductor device is formed in a device region on the substrate.

* * * * *